(12) United States Patent
Lv et al.

(10) Patent No.: US 12,232,391 B2
(45) Date of Patent: Feb. 18, 2025

(54) DISPLAY PANEL AND MOBILE TERMINAL

(71) Applicant: Wuhan China Star Optoelectronics Semiconductor Display Technology Co., Ltd., Wuhan (CN)

(72) Inventors: Lei Lv, Wuhan (CN); Meng Jin, Wuhan (CN); Lin Yang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/642,967

(22) PCT Filed: Feb. 17, 2022

(86) PCT No.: PCT/CN2022/076539
§ 371 (c)(1),
(2) Date: Mar. 15, 2022

(87) PCT Pub. No.: WO2023/151106
PCT Pub. Date: Aug. 17, 2023

(65) Prior Publication Data
US 2024/0389421 A1    Nov. 21, 2024

(30) Foreign Application Priority Data
Feb. 14, 2022  (CN) .......................... 202210131806.9

(51) Int. Cl.
*H10K 59/35* (2023.01)
*H10K 59/65* (2023.01)
*H10K 59/80* (2023.01)

(52) U.S. Cl.
CPC ........... *H10K 59/353* (2023.02); *H10K 59/65* (2023.02); *H10K 59/80521* (2023.02)

(58) Field of Classification Search
CPC . H10K 59/353; H10K 59/65; H10K 59/80521
See application file for complete search history.

(56) References Cited

U.S. PATENT DOCUMENTS 5,751,102 A    5/1998  Tanaka
2022/0209169 A1*  6/2022  Nakamura ........... H10K 50/813
(Continued)

FOREIGN PATENT DOCUMENTS

CN   110767709 A    2/2020
CN   112103318 A   12/2020
(Continued)

OTHER PUBLICATIONS

International Search Report in International application No. PCT/CN2022/076539, mailed on Nov. 17, 2022.
(Continued)

*Primary Examiner* — David Vu
*Assistant Examiner* — Brandon C Fox
(74) *Attorney, Agent, or Firm* — Nathan & Associates; Menachem Nathan

(57) ABSTRACT

A display panel and a mobile terminal are provided. Number of second sub-pixels in a second pixel repeating unit in a second display area of the display panel is same as number of first sub-pixels in a first pixel repeating unit. The second sub-pixels in the second pixel repeating unit are arranged in a way of gathering together with respect to the first sub-pixels in the first pixel repeating unit. A cathode inhibition block is disposed on an opening in a cathode layer and is located between any adjacent ones of the second pixel repeating units.

20 Claims, 6 Drawing Sheets

(56) References Cited

U.S. PATENT DOCUMENTS

2022/0336573 A1* 10/2022 Chen ................... H10K 59/131
2022/0416216 A1* 12/2022 Woo .................... H10K 50/865

FOREIGN PATENT DOCUMENTS

| | | |
|---|---|---|
| CN | 112382651 A | 2/2021 |
| CN | 212874001 U | 4/2021 |
| CN | 112838115 A | 5/2021 |
| CN | 113054133 A | 6/2021 |
| CN | 113054134 A | 6/2021 |
| CN | 113421902 A | 9/2021 |
| CN | 113629205 A | 11/2021 |
| WO | 2021184427 A1 | 9/2021 |

OTHER PUBLICATIONS

Written Opinion of the International Search Authority in International application No. PCT/CN2022/076539, mailed on Nov. 17, 2022.

Chinese Office Action issued in corresponding Chinese Patent Application No. 202210131806.9 dated Mar. 31, 2023, pp. 1-8.

\* cited by examiner

DISPLAY PANEL AND MOBILE TERMINAL

BACKGROUND OF INVENTION

1. Field of Invention

The present invention relates to a technical field of displays, and particularly to a display panel and a mobile terminal.

2. Related Art

In designing active-matrix organic light-emitting diode (AMOLED) display panels, how to achieve full-screen display and under-screen light-sensing of AMOLED panels has always been a difficult problem in which a main issue is how to improve light transmittance of panels.

In dealing with the aforementioned problem, general solutions are to dig holes in photosensitive areas of display panels. In this way, the transmittance of the display panels will be higher, but areas where the holes are formed will not emit light and will not be displayed, so full-screen effects cannot be achieved, resulting in a poor user experience. Another method that has emerged in recent years is to reduce pixel densities in photosensitive areas to increase the light transmittance as well as ensuring lighting and normal display of the photosensitive areas. This method offers a relatively good user experience, but an overall transmittance provided by this method is still low.

SUMMARY OF INVENTION

Embodiments of the present application provide a display panel and a mobile terminal in order to significantly improve light transmittance of the display panel without reducing a pixel density of a photosensitive area, so that light transmittance of the photosensitive area of the display panel increases by 86%~90% in comparison to prior art.

In order to achieve the above-mentioned object, the present application provides a technical solution as follows:

An embodiment of the present application provides a display panel including a first display area and a second display area; a substrate; and a light-emitting layer located on a side of the substrate and including a plurality of first pixel repeating units disposed in the first display area. One of the first pixel repeating units includes a plurality of first sub-pixels, and a plurality of second pixel repeating units disposed in the second display area. One of the second pixel repeating units includes a plurality of second sub-pixels, number of the second sub-pixels in the second pixel repeating unit is same as number of the first sub-pixels in the first pixel repeating unit, and a distance between any two of the second sub-pixels in the second pixel repeating unit is less than a distance between any two of the first sub-pixels in the first pixel repeating unit. A cathode inhibition layer is disposed on a side of the light-emitting layer away from the substrate and includes a plurality of cathode inhibition blocks located in the second display area and disposed between adjacent ones of the second pixel repeating units. A cathode layer is disposed on the light-emitting layer and located on the side of the light-emitting layer away from the substrate. An opening is located in the cathode layer corresponding to a position of each of the cathode inhibition blocks.

In one embodiment, an area of the first pixel repeating unit is larger than an area of the second pixel repeating unit.

In one embodiment, a distribution density of the second pixel repeating units in the second display area is the same as a distribution density of the first pixel repeating units in a region of the first display area corresponding to the shape and area of the second display area.

In one embodiment, a distribution density of the second sub-pixels in the second display area is the same as a distribution density of the first sub-pixels in the region of the first display area DA corresponding to the shape and area of the second display area SA.

In one embodiment, a distribution density of the first sub-pixels is different from a distribution density of the second sub-pixels within a unit area.

In one embodiment, an arrangement of the first sub-pixels in the first pixel repeating unit is the same as an arrangement of the second sub-pixels in the second pixel repeating unit.

In one embodiment, in a direction perpendicular to the substrate, a minimum distance between an orthographic projection of each of the cathode inhibition blocks and an orthographic projection of adjacent one of the second pixel repeating units ranges from 2 microns (μm) to 10 μm.

In one embodiment, in the direction perpendicular to the substrate, a minimum distance between the orthographic projection of the cathode inhibition block and an orthographic projection of a closest one of the second sub-pixels of the adjacent one of the second repeating units ranges from 2 μm to 10 μm.

In one embodiment, in the direction perpendicular to the substrate, a minimum distance between an orthographic projection of an opening and the orthographic projection of the adjacent second repeating unit ranges from 2 μm to 10 μm.

In one embodiment, in the direction perpendicular to the substrate, a minimum distance between the orthographic projection of the opening and an orthographic projection of a closest one of the second sub-pixels of the adjacent second repeating unit ranges from 2 μm to 10 μm.

In one embodiment, in the second display area SA, an area ratio of the cathode inhibition layer ranges from 5% to 95%.

In one embodiment, an area of the opening is less than that of a corresponding one of the cathode inhibition blocks, and the cathode layer covers at least part of an edge of the corresponding cathode inhibition block.

In one embodiment, the display panel further includes: a driving circuit layer disposed between the substrate and the light-emitting layer and including a plurality of first driving circuits for driving the first sub-pixels and a plurality of second driving circuits for driving the second sub-pixels, and a transition area defined between the first display area and the second display area. The first driving circuits are disposed in the first display area and electrically connected with the corresponding first sub-pixels, and the second driving circuits are disposed in the transition area and electrically connected to the corresponding second sub-pixels, or the second driving circuits are arranged in the second display area and disposed in a stack arrangement with the second pixel repeating unit including the second sub-pixels corresponding to the second driving circuits. The second driving circuits are electrically connected to the corresponding second sub-pixels. The second driving circuits are disposed in the transition area and electrically connected to the corresponding second sub-pixels, or the second driving circuits are arranged in the second display area and disposed in a stack arrangement with the second pixel repeating unit including the second sub-pixels corresponding to the second driving circuits. The second driving circuits are electrically connected to the corresponding second sub-pixels.

In one embodiment, the second driving circuits are electrically connected to the second sub-pixels in the corresponding second pixel repeating unit that display the same color.

In one embodiment, the second sub-pixels include first color sub-pixels, second color sub-pixels, and third color sub-pixels, and each of the second pixel repeating units at least includes one of the first color sub-pixels, one of the second color sub-pixels, and one of the third color sub-pixels.

In one embodiment, the first color sub-pixels display blue, the second color sub-pixels display red, and the third color sub-pixels display green.

The present application further provides a mobile terminal, including a display panel and a photosensitive element disposed corresponding to the display panel.

The display panel includes a first display area and a second display area, a substrate, and a light-emitting layer located on a side of the substrate and including a plurality of first pixel repeating units disposed in the first display area. One of the first pixel repeating units includes a plurality of first sub-pixels, and a plurality of second pixel repeating units are disposed in the second display area. One of the second pixel repeating units includes a plurality of second sub-pixels, number of the second sub-pixels in the second pixel repeating unit is same as number of the first sub-pixels in the first pixel repeating unit, and a distance between any two of the second sub-pixels in the second pixel repeating unit is less than a distance between any two of the first sub-pixels in the first pixel repeating unit. A cathode inhibition layer is disposed on a side of the light-emitting layer away from the substrate and includes a plurality of cathode inhibition blocks located in the second display area and disposed between adjacent ones of the second pixel repeating units. A cathode layer is disposed on the light-emitting layer and located on the side of the light-emitting layer away from the substrate. An opening is located in the cathode layer corresponding to a position of each of the cathode inhibition blocks.

In one embodiment, the photosensitive element includes any one of a camera, an infrared sensor, a fingerprint sensor, or a distance sensor.

In one embodiment, an area of the first pixel repeating unit is larger than an area of the second pixel repeating unit.

In one embodiment, a distribution density of the second pixel repeating units in the second display area is the same as a distribution density of the first pixel repeating units in a region of the first display area corresponding to the shape and area of the second display area.

The present application has advantageous effects as follows: in the present application, the second pixel repeating units are disposed in the second display area and one of the second pixel repeating units includes the second sub-pixels, wherein the number of the second sub-pixels in the second pixel repeating unit is the same as the number of the first sub-pixels in one of the first pixel repeating unit, and the distance between any two of the second sub-pixels in the second pixel repeating unit is less than the distance between any two of the first sub-pixels in the first pixel repeating unit. With the above structure, in the second display area, the second sub-pixels in the second pixel repeating unit are arranged more compactly. On the basis of not reducing pixels per inch (PPI) of the display panel in the second display area, the gap between adjacent ones of the second pixel repeating units is relatively large. The cathode inhibition block is disposed between two of the second pixel repeating units and is configured to prevent the material of the cathode layer from being deposited in the area where the cathode inhibition block is disposed, so as to achieve an effect of reducing the area ratio of the cathode layer in the display panel and increasing the light transmittance of the display panel, so that the light transmittance of the second display area of the display panel is improved as a whole. Compared with prior art, the light transmittance is increased by 86%-90%, which greatly improves the user experience.

DESCRIPTION OF PREFERRED EMBODIMENTS

The present application provides a display panel and a mobile terminal. In order to make the objectives, technical solutions, and effects of the present application clearer, the present application will be further described in detail below with reference to the accompanying drawings and embodiments. It should be understood that the specific embodiments described here are only used to illustrate the present application, and are not used to limit the present application.

The embodiments of the present application provide a display panel and a method of manufacturing the same. Detailed descriptions are given below. It should be noted that the description order of the following embodiments is not intended to limit the preferred order of the embodiments.

Currently, in order to improve light transmittance of display panels, general designs are to dig holes in photosensitive areas of display panels. In this way, the transmittance of the display panels will be higher, but areas where the holes are formed in will not emit light and will not be displayed, so full-screen effect cannot be achieved, resulting in a poor user experience. Another method that has emerged in recent years is to reduce pixel densities in photosensitive areas to increase the light transmittance as well as ensuring that the photosensitive areas emit light and display normally. This method offers a relatively good user experience, but an overall transmittance provided by this method is still low.

In order to further improve the transmittance of the display panel and ensure the normal light emission of the photosensitive area, the present application provides the following technical solutions.

The present application provides a display panel, as shown in FIGS. 1, 2, 3, and 5. The display panel includes a first display area DA and a second display area SA.

Figure 5:
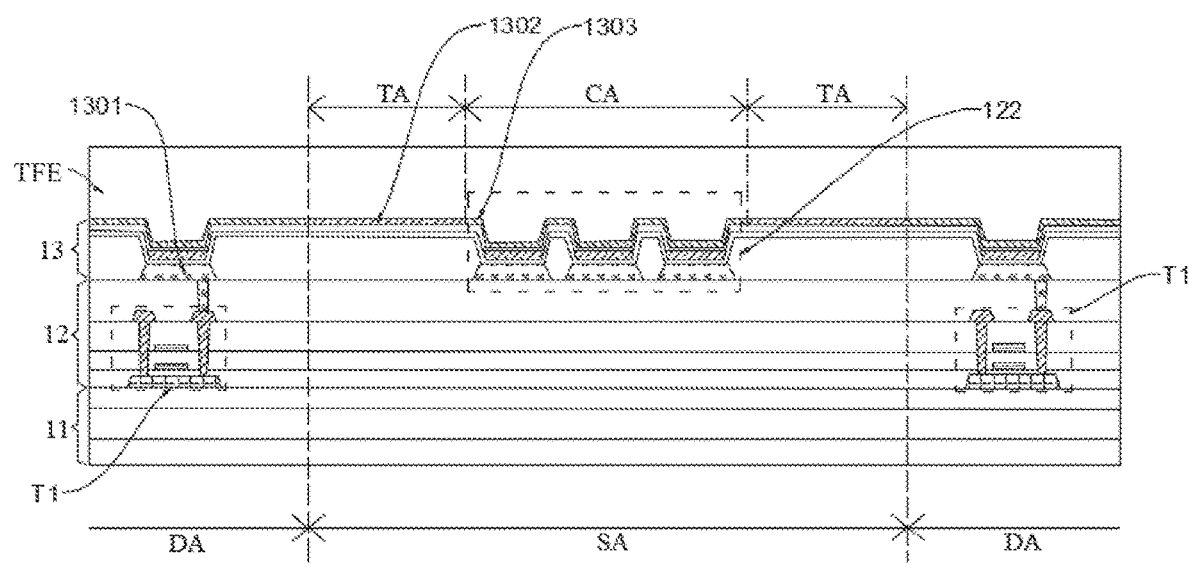
FIG. 5 is a cross-sectional view of the display panel in accordance with an embodiment of the present application.

Specifically, as shown in FIG. 5, the second display area SA includes a plurality of pixel gathering areas CA and light transmission areas TA in a remaining area other than the pixel gathering areas CA.

Specifically, a photosensitive element is disposed on one side of the display panel. The photosensitive element includes cameras, infrared sensors, fingerprint sensors, distance sensors, and the like. The photosensitive element is disposed corresponding to the second display area SA and is located on a side of a backlight surface of the display panel in the second display area SA.

Specifically, the display panel may be an organic light-emitting semiconductor display panel.

Figure 1:
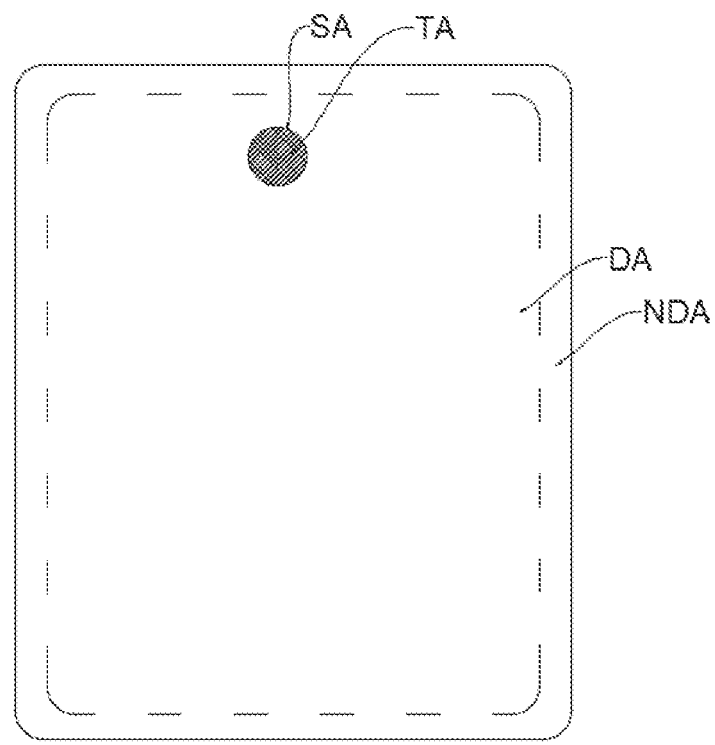
FIG. 1 is a schematic plan view of a display panel in accordance with an embodiment of the present application.
Figure 8:
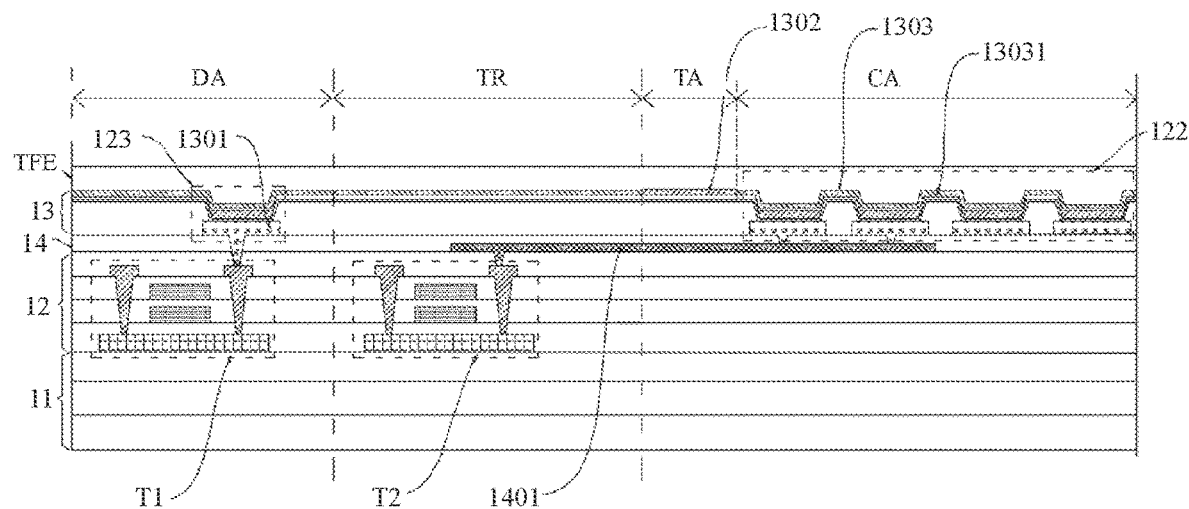
FIG. 8 is a cross-sectional view of the display panel in accordance with another embodiment of the present application.

This embodiment is described by taking the photosensitive element as a camera as an example, and a conventional camera is provided in the display panel. As shown in FIG. 1, the display panel further includes a non-display area NDA surrounding the first display area DA, and the first display area DA may be arranged to surround the second display area SA. As shown in FIG. 5, the second display area SA includes the pixel gathering areas CA and the light transmission areas TA. As shown in FIG. 8, a transition area TR is disposed between the first display area DA and the second display area SA and surrounds the second display area SA.

Specifically, each of the first display area DA and the second display area SA is configured for display, and sub-pixels that emit light are not arranged in the non-display area NDA.

Figure 9:
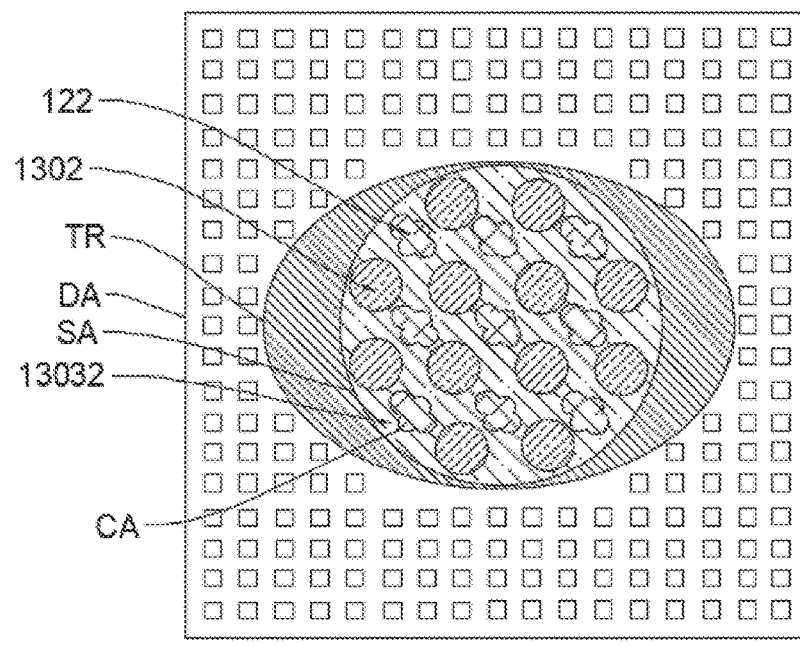
FIG. 9 is a schematic view of structures in the second display area of the display panel in accordance with an embodiment of the present application.

Specifically, as shown in FIG. 9, an area of the first display area DA is greater than an area of the second display area SA; the transition area TR may be annular; a projection shape of the second display area SA on a substrate 11 may be circular, oval, square, or polygonal, and a specific shape may be varied according to actual production needs.

Specifically, a second pixel repeating unit 122 is disposed in one of the pixel gathering areas CA.

As shown in FIGS. 5, 6, 7, and 8, the display panel further includes a substrate 11. A light-emitting layer is located on a side of the substrate 11 and includes a plurality of first pixel repeating units 121 disposed in the first display area DA. One of the first pixel repeating units 121 includes a plurality of first sub-pixels 123. A plurality of second pixel repeating units 122 are correspondingly disposed in a plurality of the pixel gathering areas CA. One of the second pixel repeating units 122 includes a plurality of second sub-pixels 124, number of the second sub-pixels 124 in the second pixel repeating unit 122 is the same as number of the first sub-pixels 123 in the first pixel repeating unit 121, and a distance between any two of the second sub-pixels 124 in the second pixel repeating unit 122 is less than a distance between any two of the first sub-pixels 123 in the first pixel repeating unit 121. A cathode inhibition layer is disposed on a side of the light-emitting layer away from the substrate 11. The cathode inhibition layer includes a plurality of cathode inhibition blocks 1302 located in the second display area SA and disposed between adjacent ones of the second pixel repeating units 122. A cathode layer 1303 is disposed on the light-emitting layer and located on the side of the light-emitting layer away from the substrate 11, wherein an opening is located in the cathode layer 1303 corresponding to a position of each of the cathode inhibition blocks 1302.

Figure 4:
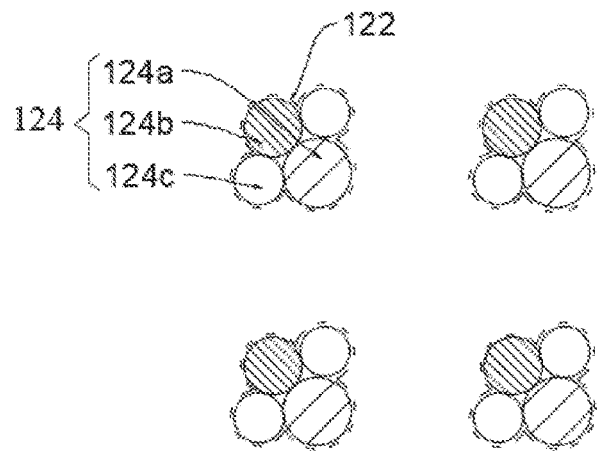
FIG. 4 is a schematic view of an arrangement of the second pixel repeating units in the second display area of the display panel in accordance with another embodiment of the present application.

Specifically, as shown in FIGS. 4 and 5, the display panel mainly includes the substrate 11, a driving circuit layer 12 disposed on the substrate 11, an organic light-emitting device layer 13 disposed on a side of the driving circuit layer 12 away from the substrate 11, and a thin-film encapsulation layer TFE disposed on a side of the organic light-emitting device layer 13 away from the driving circuit layer 12.

As shown in FIG. 5, the substrate 11 may be a structure in which three layers of base substrates are stacked and specifically include a first organic layer, an inorganic layer, and a second organic layer stacked in sequence. The first organic layer and the second organic layer are both polyimide layers, and the inorganic layer is at least one of a silicon nitride layer or a silicon oxide layer.

The driving circuit layer 12 includes a plurality of overlapping layers, a plurality of first pixel driving circuits T1, and a plurality of second pixel driving circuits T2. The first pixel driving circuits T1 are configured to control the first sub-pixels 123 on the light-emitting layer to emit light, and the second pixel driving circuits T2 are configured to control the second sub-pixels 124 on the light-emitting layer to emit light.

The first pixel driving circuits T1 may be located in the first display area DA. The second pixel driving circuits T2 may be located in the first display area DA or in the second display area SA. When being located in the second display area SA, the second pixel driving circuits T2 cannot affect the light transmission of the light transmission area TA. For example, the second driving circuits T2 are arranged in a stack arrangement with the second pixel repeating unit 122 including the second sub-pixels 124 corresponding to the second driving circuits T2.

Figure 6:
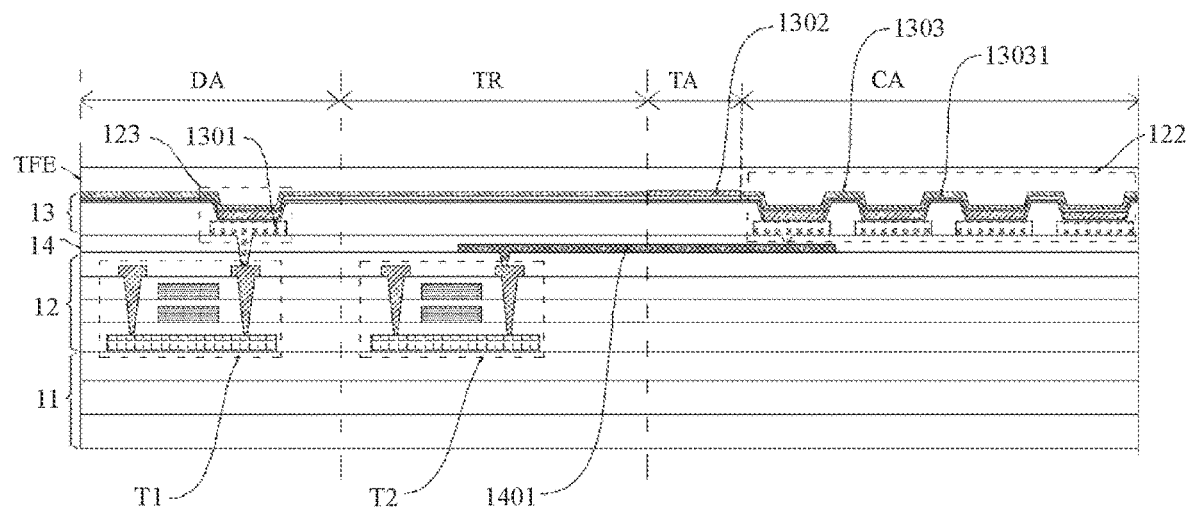
FIG. 6 is a cross-sectional view of the display panel in accordance with another embodiment of the present application.

In this embodiment, as shown in FIG. 6, the organic light-emitting device layer 13 includes an anode layer 1301, the light-emitting layer, and the cathode layer 1303.

As shown in FIG. 6, the light-emitting layer includes the first pixel repeating units 121 (shown in FIG. 2) located in the first display area DA and the second pixel repeating units 122 (shown in FIG. 3 or FIG. 4) located in the second display area SA).

The first pixel repeating units 121 can be arranged in an array in the first display area DA as repeating units, and the second pixel repeating units 122 can be arranged in an array in the second display area SA as repeating units One of the first pixel repeating units 121 includes a plurality of the first sub-pixels 123. One of the second pixel repeating units 122 includes a plurality of the second sub-pixels 124.

A number of the first sub-pixels 123 in the first pixel repeating unit 121 is not limited, and may be 3, 4 or 5, and the first sub-pixels 123 may display one or more of red, green, or blue. A number of the second sub-pixels 124 in the second pixel repeating unit 122 is not limited, and may be 3, 4 or 5, and the second sub-pixels 124 may display one or more of red, green, or blue.

A distribution density of the second pixel repeating units 122 in the second display area SA is same as a distribution density of the first pixel repeating units 121 in a region of the first display area DA corresponding to a shape and area of the second display area SA.

It should be noted that the distribution density refers to a ratio of the number to the area. For example, the distribution density of the second pixel repeating units 122 in the second display area SA refers to a ratio of a number of the second pixel repeating units 122 in the second display area SA to an area of the second display area SA.

A shape of the second sub-pixels 124 in the second pixel repeating unit 122 is the same as a shape of the first sub-pixels 123 in the first pixel repeating unit 121. An arrangement of the second sub-pixels 124 in the second pixel repeating unit 122 is same as an arrangement of the first sub-pixels 123 in the first pixel repeating unit 121. But a distance between adjacent ones of the second sub-pixels 124 in the second pixel repeating unit 122 is less than a distance between adjacent ones of the first sub-pixels 123 in the first pixel repeating unit 121.

The anode layer 1301 includes first anodes corresponding to the first sub-pixels 123, and second anodes corresponding to the second sub-pixels 124.

It should be noted that number and positions of the first sub-pixels 123 correspond to number and positions of the first anodes, and number and positions of the second sub-pixels 124 correspond to number and positions of the second anodes.

Specifically, as shown in FIG. 9, an orthographic projection of the cathode inhibition block 1302 on the substrate 11 is located in a gap between orthographic projections of the second pixel repeating units 122 on the substrate 11.

Specifically, shapes of the orthographic projections of the cathode inhibition blocks 1302 on the substrate 11 include one or more of a circle, a square, or a polygon.

Specifically, In the second display area SA, an area ratio of the cathode inhibition layer in the second display area SA may be one of 5%, 6%, 10%, 20%, 40%, 60%, 75%, 80%, 95%, etc. A specific value can be in a range of 5%~95%. The larger the area ratio of the cathode inhibition layer is, the higher the transmittance of the display panel is, so the higher the requirements for production processes are.

Specifically, the cathode inhibition layer is fabricated before the cathode layer 1303. A high-precision metal mask is used to vapor-deposit a cathode inhibition layer in a predetermined light transmittance area TA in advance between adjacent ones of the second pixel repeating units 122. The cathodic inhibition layer includes the cathodic inhibition blocks 1302. Then, the cathode layer 1303 is vapor-deposited on an entire surface of the same layer. A material of the cathode layer 1303 will not be evaporated at positions where the cathode inhibition blocks 1302 are formed (that is, an opening corresponding to the cathode inhibition block 1302 is formed on the cathode layer 1303). By using this technical means, the area ratio of the cathode layer 1303 can be reduced, thereby improving light transmittance of the light transmittance area TA.

Specifically, a material of the cathode inhibition block 1302 includes at least one of BAlq(bis(2-methyl-8-hydroxyquinoline)-4-(p-phenylphenol)aluminum), TAZ(3-(biphenyl-4-yl)-5-(4-tert-butylphenyl)-4-phenyl-4H-1,2,4-triazole), or indium tin oxide (ITO). The present application includes, but is not limited to, the above-mentioned materials, and materials that can make the material of the cathode layer 1303 not deposited on the cathode inhibition block during evaporation are all within the scope of protection of the present application.

Figure 10:
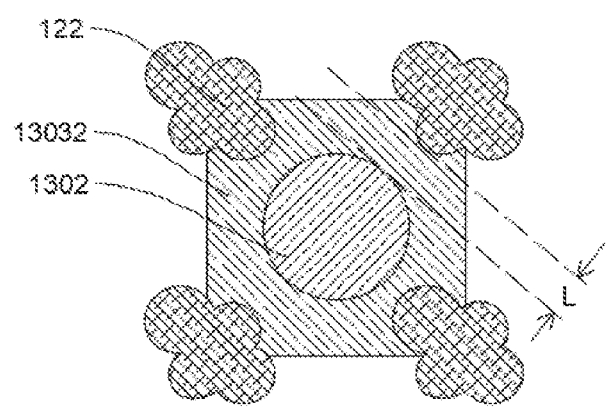
FIG. 10 is a schematic view of partial structures in the second display area of the display panel in accordance with another embodiment of the present application.

Specifically, as shown in FIGS. 9 and 10, a distance L is defined between a pixel opening (not shown) of the second sub-pixel 124 adjacent to the cathode inhibition block 1302 in the second repeating unit 122 and an edge of an orthographic projection of the cathode inhibition layer on the substrate. The distance L ranges from 2 microns (μm) to 10 μm to ensure that the cathode inhibition layer does not fall within the pixel opening of the second sub-pixel 124 of the second pixel repeating unit 122, thus adversely affecting lighting of the second sub-pixel 124.

Specifically, as shown in FIGS. 8 and 9, In the second display area SA, the cathode layer 1303 is integrally disposed and includes a plurality of cathode functional parts 13031 and cathode connection parts 13032. One of the cathode functional parts 13031 correspondingly covers a plurality of the second anodes arranged at intervals in one of the second repeating units. The cathode connection parts 13032 connect each of the cathode functional parts 13031 to the cathode layer 1303 in the first display area DA, thereby driving the second sub-pixels 124 to emit light.

Specifically, materials of the cathode layer 1303 and the anode layer 1301 include at least one of molybdenum, aluminum, titanium, lithium, tungsten, copper, or silver.

It can be understood that, in this embodiment, by arranging the second pixel repeating units 122 in the second display area SA of the display panel, each of the second pixel repeating units 122 includes the second sub-pixels 124, and the number of the second sub-pixels 124 in the second pixel repeating unit 122 is the same as the number of the first sub-pixels 123 in the first pixel repeating unit 121. In addition, the distance between any two of the second sub-pixels 124 in the second pixel repeating unit 122 is less than the distance between any two of the first sub-pixels 123 in the first pixel repeating unit 121, so that the second sub-pixels 124 of the second pixel repeating unit 122 are arranged more closely in the second display area SA. On the basis of not reducing pixels per inch (PPI) of the display panel in the second display area SA, the gap between the second pixel repeating units 122 is significantly greater than the gaps between the first pixel repeating units 121. The cathode inhibition block 1302 is disposed between any two of the second pixel repeating units 122. The cathode inhibition block 1302 can prevent the material of the cathode layer 1303 from being deposited in an area where the cathode inhibition block 1302 is disposed, so as to achieve an effect of increasing the light transmittance of the panel and reduce the area ratio of the cathode layer 1303 in the display panel, so that the light transmittance of the second display area SA of the display panel is improved as a whole. Compared with prior art, the light transmittance is increased by 86%-90%, which greatly improves the user experience.

Compared with a technical solution that the second sub-pixels 124 are not gathered together in the second pixel repeating unit 122 and the cathode inhibition layer is directly disposed at the gaps between the second pixel repeating units 122, the light transmittance only increases by 60% in comparison to conventional display panels when using the technical solution of only disposing the cathode inhibition layer. In the embodiment of the present application, while the second sub-pixels 124 are disposed by gathering together, the cathode inhibition layer is arranged between the second pixel repeating units 122, so that the light transmittance of the display panel increases by 86%~90%, which greatly improves the user experience.

In one embodiment, an area of the first pixel repeating unit 121 is larger than an area of the second pixel repeating unit 122.

Figure 2:
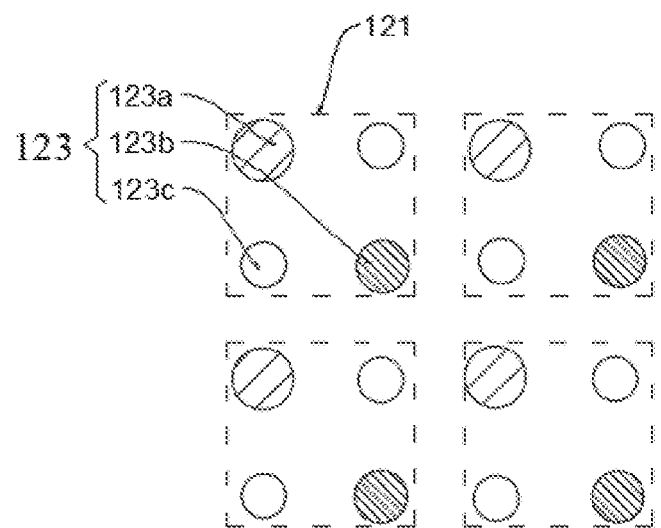
FIG. 2 is a schematic view of an arrangement of first pixel repeating units in a first display area of the display panel in accordance with an embodiment of the present application.
Figure 3:
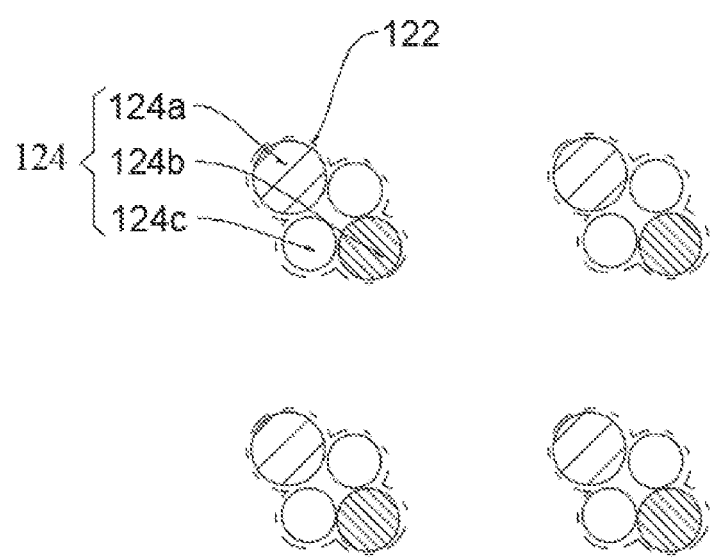
FIG. 3 is a schematic view of an arrangement of second pixel repeating units in a second display area of the display panel in accordance with an embodiment of the present application.

Specifically, as shown in FIGS. 2 and 3, the first pixel repeating unit 121 in FIG. 2 includes four first sub-pixels 123. The four first sub-pixels 123 include two green first sub-pixels 123c displaying green, one red first sub-pixel 123b displaying red, and one blue first sub-pixel 123a displaying blue. Specifically, the one blue first sub-pixel 123a displaying blue, the one red first sub-pixel 123b displaying red, and the two green first sub-pixels 123c displaying green collectively form the first pixel repeating unit 121 in a rectangular structure.

The second pixel repeating unit 122 in FIG. 3 includes four second sub-pixels 124. In the four second sub-pixels 124, two of them are green second sub-pixels 124c displaying green, one is a red second sub-pixel 124b displaying red, and one is a blue second sub-pixel 124a displaying blue. Specifically, the one blue second sub-pixel 124a displaying blue, the one red second sub-pixel 124b displaying red, and the two green second sub-pixels 124c displaying green collectively form the second pixel repeating unit 122 in a compact rhombus-like structure.

As can be seen from FIGS. 2 and 3 (or 4), a combination of the first sub-pixels 123 displaying different colors in the first pixel repeating unit 121 and a combination of the second sub-pixels 122 displaying different colors in the second pixel repeating unit 124 are the same. A difference lies in that a spacing between the four first sub-pixels 123 is greater than a spacing between the four second sub-pixels 124, making an area of the first pixel repeating unit 121 being larger than an area of the second pixel repeating unit 122.

In one embodiment, a distribution density of the second pixel repeating units 122 in the second display area SA is the same as a distribution density of the first pixel repeating units 121 in a region of the first display area DA corresponding to the shape and area of the second display area SA.

Specifically, it this embodiment, the distribution density refers to a ratio of the number to the area. For example, the distribution density of the second pixel repeating units 122 in the second display area SA refers to a ratio of the number of the second pixel repeating units 122 in the second display area SA to the area of the second display area SA.

Correspondingly, in the region of the first display area DA corresponding to the shape and area of the second display area SA, the number of the first pixel repeating units 121 is the same as the number of the second pixel repeating units 122 in the second display area SA. Specifically, a distribution density of the second pixel repeating units 122 in the second display area SA is the same as a distribution density of the first pixel repeating units 121 in the region of the first display area DA corresponding to the shape and area of the second display area SA.

In one embodiment, a distribution density of the second sub-pixels 124 in the second display area SA is the same as a distribution density of the first sub-pixels 123 in the region of the first display area DA corresponding to the shape and area of the second display area SA.

Specifically, a distribution density of the second pixel repeating units 122 in the second display area SA is the same as a distribution density of the first pixel repeating units 121 in the region of the first display area DA corresponding to the shape and area of the second display area SA. In detail, the shape of the second sub-pixels 124 in the second pixel repeating unit 122 is the same as the shape of the first sub-pixels 123 in the first pixel repeating unit 121. The difference lies in that the spacing between the second sub-pixels 124 is less than the spacing between the first sub-pixels 123.

In one embodiment, a distribution density of the first sub-pixels 123 is different from a distribution density of the second sub-pixels 124 within a unit area.

Specifically, since the spacing between the first sub-pixels 123 in the first repeating unit 121 is relatively large, the spacing between the second sub-pixels 124 in the second repeating unit 122 is relatively small, and the area of the first repeating unit 121 is larger than that of the second repeating unit 122. For example, comparing FIGS. 2 and 3, when the area of the second repeating unit 122 is taken as the unit area, within that unit area, the distribution density of the first sub-pixels 123 is different from the distribution density of the second sub-pixels 124.

In one embodiment, an arrangement of the first sub-pixels 123 in the first pixel repeating unit 121 is the same as an arrangement of the second sub-pixels 124 in the second pixel repeating unit 122.

Specifically, the arrangement means that in the pixel repeating units, number of sub-pixels displaying different colors and corresponding arrangement positions of the sub-pixels are the same between the first pixel repeating unit and the second pixel repeating unit. As shown in FIGS. 2 and 3, the first pixel repeating unit 121 in FIG. 2 includes four first sub-pixels 123. The four first sub-pixels 123 include two green first sub-pixels 123c displaying green, one red first sub-pixel 123b displaying red, and one blue first sub-pixel 123a displaying blue. Specifically, the one blue first sub-pixel 123a is located at an upper left corner, the one red first sub-pixel 123b is located at a lower right corner, and the two green first sub-pixels 123c are located a lower left corner and an upper right corner, respectively.

The second pixel repeating unit 122 in FIG. 3 includes the four second sub-pixels 124. In the four second sub-pixels 124, two of them are the green second sub-pixels 124c displaying green, one is the red second sub-pixel 124b displaying red, and one is the blue second sub-pixel 124a displaying blue. Specifically, the one blue first sub-pixel 123a is located at the upper left corner, the one red first sub-pixel 123b is located at the lower right corner, and the two green first sub-pixels 123c are located the lower left corner and the upper right corner, respectively.

It can be seen that an arrangement of the four first sub-pixels 123 in the first pixel repeating unit 121 is the same as an arrangement of the four second sub-pixels 124 in the second pixel repeating unit 122.

It can be understood that by setting the distribution density of the first sub-pixels 123 in the region of the first display area DA corresponding to the shape and area of the second display area SA the same as the distribution density of the second sub-pixels 124 in the second display area SA, the PPI of the display panel in the first display area DA and the second display area SA are the same, which ensures that the display effect of the display panel in the second display area SA is not inferior to that of the display panel in the first display area DA. Furthermore, due to the technical means that the second sub-pixels 124 in the second display area SA are gathered together, the spacing between adjacent second pixel repeating units 122 is increased, and the light transmittance of the second display area SA of the display panel is improved.

In one embodiment, in a direction perpendicular to the substrate 11, a distance between an orthographic projection of each of the cathode inhibition blocks 1302 and an orthographic projection of the adjacent second pixel repeating unit 122 ranges from 2 μm to 10 μm.

Specifically, as shown in FIG. 9, the distance L is defined between the orthographic projection of the cathode inhibition block 1302 on the substrate 11 and the second pixel repeating unit 122 adjacent to the cathode inhibition block 1302. There is a certain distance between the orthographic projection of the cathode inhibition block 1302 and the adjacent second repeating unit 122 in order to prevent the cathode inhibition block 1302 from falling into the pixel opening of the second sub-pixel 124 during a manufacturing process of the cathode inhibition block 1302.

In one embodiment, in the direction perpendicular to the substrate 11, a minimum distance between the orthographic projection of the cathode inhibition block 1302 and an orthographic projection of a closest one of the second sub-pixels of the adjacent second repeating unit 122 ranges from 2 μm to 10 μm.

It should be noted that the term "closest" can be understood that there are multiple distance values between the orthographic projection of the cathode inhibition block 1302 and the orthographic projections of the second sub-pixels 124. The second sub-pixel 124 corresponding to a smallest distance value among the distance values is the closest second sub-pixel 124. The interpretation of "closest" in the following implementation is the same.

Specifically, since the cathode inhibition block 1302 is disposed between adjacent ones of the second repeating units 122, in order to prevent the material of the cathode inhibition block 1302 from falling into the pixel opening of the second sub-pixel 124 during the manufacturing process, it is necessary to keep a certain distance between the cathode inhibition block 1302 and the adjacent second repeating unit 122 and to limit the distance to 2 μm~10 μm.

In one embodiment, in the direction perpendicular to the substrate 11, a minimum distance between an orthographic projection of an opening and the orthographic projection of the adjacent second repeating unit 122 ranges from 2 μm to 10 μm.

Specifically, the cathode inhibition block 1302 is disposed corresponding to the opening, and the cathode layer 1303 is a monolithic structure to ensure normal light emission of the sub-pixels. Therefore, a minimum distance between the orthographic projection of the opening on the cathode layer 1303 and the adjacent second repeating unit 122 also needs to be limited to the range from 2 μm to 10 μm, wherein the range includes endpoint values.

In one embodiment, in the direction perpendicular to the substrate 11, a minimum distance between the orthographic projection of the opening and an orthographic projection of a closest one of the second sub-pixels 124 of the adjacent second repeating unit 122 ranges from 2 μm to 10 μm.

Specifically, the cathode inhibition block 1302 is disposed corresponding to the opening, and the cathode layer 1303 is a monolithic structure to ensure normal light emission of the sub-pixels. Therefore, a minimum distance between the orthographic projection of the opening on the cathode layer 1303 and the orthographic projection of the closest second sub-pixel 124 of the adjacent second repeating unit 122 also needs to be limited to the range from 2 μm to 10 μm. Specifically, the range includes the endpoint values, so that during fabrication of the cathode inhibition block 1302, the material of the cathode inhibition block 1302 will not fall within the pixel opening of the second sub-pixel 124 to adversely affect the normal display of the second sub-pixel 124.

It can be understood that by setting the aforementioned range, it can be ensured that during the fabrication process of the cathode inhibition block 1302, the material of the cathode inhibition block 1302 will not fall within the opening of the second sub-pixel 124, thus adversely affecting the normal lighting of the second sub-pixel 124.

In one embodiment, in the second display area SA, an area ratio of the cathode inhibition layer ranges from 5% to 95%.

It can be understood that by setting the area ratio of the cathode inhibition layer in the second display area SA to 5% to 95%, the transmittance of the display panel can be effectively improved. In addition, the abnormal display of the second sub-pixel 124 caused by an excessive area of the display panel in the second display area SA occupied by the cathode inhibition layer is prevented.

In one embodiment, an area of the opening is less than that of a corresponding one of the cathode inhibition blocks 1302, and the cathode layer 1303 covers at least part of an edge of the corresponding cathode inhibition block 1302.

Specifically, due to the fabrication process, in this embodiment, the cathode inhibition layer is formed first, and then the cathode layer 1303 is formed. Therefore, a situation where the cathode layer 1303 and the cathode inhibition block 1302 are partially overlapped may occur at a juncture of the cathode inhibition block 1302 and the cathode layer 1303.

In one embodiment, the display panel further includes the following components.

A driving circuit layer 12 is disposed between the substrate 11 and the light-emitting layer and includes a plurality of first driving circuits T1 for driving the first sub-pixels 123 and a plurality of second driving circuits T2 for driving the second sub-pixels 124.

A transition area TR is defined between the first display area DA and the second display area SA.

Specifically, the first driving circuits T1 are disposed in the first display area DA and electrically connected with the corresponding first sub-pixels 123.

The second driving circuits T2 are disposed in the transition area TR and electrically connected to the corresponding second sub-pixels 124. Alternatively, the second driving circuits T2 are arranged in the second display area SA and disposed in a stack arrangement with the second pixel repeating unit 122 including the second sub-pixels 124 corresponding to the second driving circuits, wherein the second driving circuits T2 are electrically connected to the corresponding second sub-pixels 124.

Specifically, the first display area DA is located at a periphery of the second display area SA. The transition area TR is disposed between the first display area DA and the second display area SA and surrounds the second display area SA. The first pixel driving circuits T1 electrically connected to the first sub-pixels 123 are disposed in the first display area DA. The second driving circuits T2 may be disposed in the transition area TR to be electrically connected to the second sub-pixels 124, or may be disposed in the second display area SA and located in a stack arrangement with the second pixel repeating unit 122 which includes the second sub-pixels 124 corresponding to the second driving circuits. The second pixel driving circuits T2 are electrically connected to the second sub-pixels 124.

It should be noted that the light transmittance area TA in FIG. 5 and FIG. 6 only shows the cathode inhibition layer in the light transmittance area TA, and does not illustrate the cathode layer 1303.

Specifically, the driving circuit layer 12 includes the first pixel driving circuits T1, the second pixel driving circuits T2, and the driving circuit layer 12 is disposed on a side of the light-emitting layer close to the substrate 11.

The first pixel driving circuits T1 and the second pixel driving circuits T2 may be the same or different. The first pixel driving circuits T1 and the second pixel driving circuits T2 are selected from one of a 7T1C circuit, a 6T1C circuit, a 6T2C circuit, a 5T1C circuit, a 4T1C circuit, a 3T1C circuit, or a 2T1C circuit, respectively.

Specifically, the first pixel driving circuits T1 and the first sub-pixels 123 are electrically connected through metal wires, and the electrical connection between the second pixel driving circuits T2 and the second sub-pixels 124 are achieved through transparent wires 1401 and metal wires.

Specifically, as shown in FIG. 6, the transparent wires 1401 constitutes a transparent wiring layer 14. The transparent wiring layer 14 is located between the organic light-emitting device layer 13 and the pixel driving unit circuit layer 12.

Specifically, the second pixel driving circuits T2 are located in the transition area TR and disposed between the organic light-emitting device layer 13 and the substrate 11. The second sub-pixels 124 in the second display area SA are electrically connected to the second pixel driving circuits T2 to drive the second sub-pixels 124 to emit light. The first pixel driving circuits T1 are assembled and arranged to form a plurality of pixel driving circuit islands.

Figure 7:
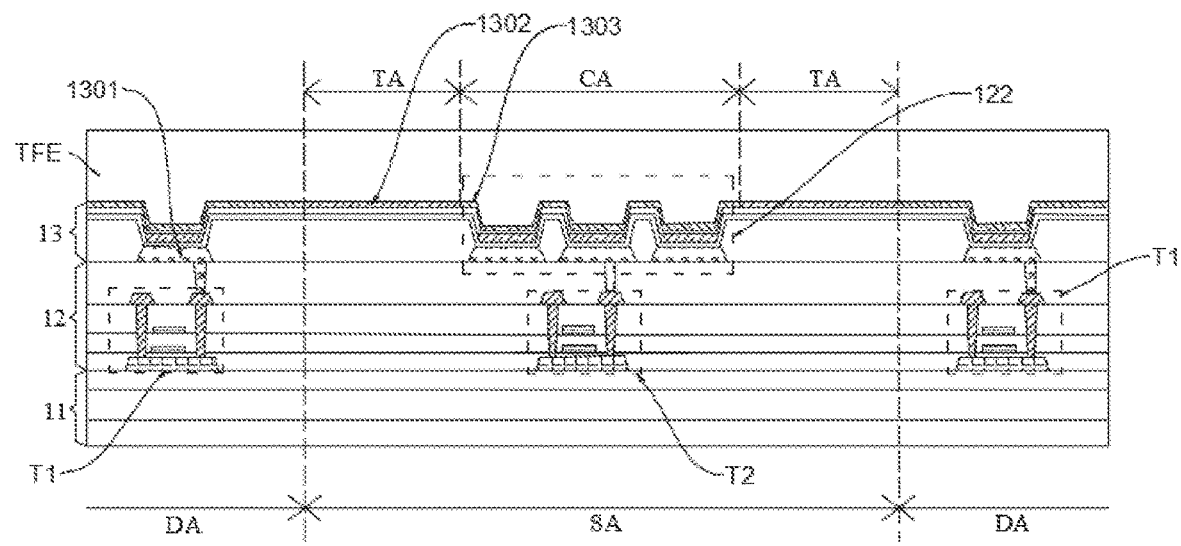
FIG. 7 is another cross-sectional view of the display panel excluding a transition area in accordance with an embodiment of the present application.

It can be understood that by arranging the second pixel driving circuits T2 corresponding to the second sub-pixels 124 in the second pixel repeating unit 122 in the transition region TR, the second pixel driving circuits T2 connected to the second sub-pixels 124 through the transparent wires 1401 can further improve the light transmittance of the second display area SA. In this way, complexity of the transparent wires 1401 is simplified, a space utilization rate of the display panel is improved, and a short circuit between the lines is prevented. As shown in FIG. 7, by disposing the second pixel driving circuits T2 corresponding to the second sub-pixels 124 in the second pixel repeating unit 122 on a side of the second pixel repeating unit 122 close to the substrate such that the second pixel driving circuits T2 are disposed in the stack arrangement with the second pixel repeating unit 122, the complexity of the transparent wires 1401 can be reduced, thereby improving the light transmittance of the display panel.

In one embodiment, the second driving circuits T2 are also electrically connected to the second sub-pixels 124 in the corresponding second pixel repeating unit 122 that display the same color.

Specifically, as shown in FIG. 8, the second sub-pixels 124 of a same color can be driven by the same second pixel driving circuits T2 to realize synchronous switching of the second sub-pixels 124 of the same color, thus improving display efficiency and reducing wiring difficulty.

In one embodiment, the second sub-pixels 124 include first color sub-pixels, second color sub-pixels, and third color sub-pixels.

The second pixel repeating unit at least includes one of the first color sub-pixels, one of the second color sub-pixels, and one of the third color sub-pixels.

Specifically, colors displayed by the second sub-pixels 124 include, but not limited to, red, green, and blue colors.

Specifically, the first color sub-pixels can display blue color, the second color sub-pixels can display red color, and the third color sub-pixels can display green color.

Specifically, an opening area of the second color sub-pixel displaying red is larger than or equal to an opening area of the third color sub-pixel displaying green, and an opening area of the first color sub-pixel displaying blue is larger than that of the second color sub-pixel displaying red.

For example, as shown in FIGS. 2, 3, and 4, the first pixel repeating unit 121 includes four first sub-pixels 123. The four first sub-pixels 123 include two green first sub-pixels 123c displaying green, one red first sub-pixel 123b displaying red, and one blue first sub-pixel 123a displaying blue.

Correspondingly, the second pixel repeating unit 122 includes four second sub-pixels 124. The four second sub-pixels 124 include two green second sub-pixels 124c displaying green, one red second sub-pixel 124b displaying red, and one blue second sub-pixel 124a displaying blue.

It can be understood that by providing the first pixel repeating unit 121 and the second pixel repeating unit 122 to include sub-pixels displaying three colors of red, green, and blue, the display effect of the display panel can be further improved, thereby achieving full-color display.

In one embodiment, the second pixel repeating unit 122 includes one first color sub-pixel, one second color sub-pixel, and two third-color sub-pixels. Specifically, an area of the first color sub-pixel is larger than an area of the second color sub-pixel, and the area of the first color sub-pixel is larger than an area of the third color sub-pixel.

Specifically, the first color sub-pixel displays blue color, the second color sub-pixel display red color, and the third color sub-pixel display green color.

It can be understood that since the sub-pixels displaying blue are limited by materials, under a same opening area, a service life of the sub-pixels displaying blue is shorter than that of the sub-pixels displaying red or green. In order to improve a service life of the display panel, the second sub-pixels 124 in the second repeating unit 122 are configured as sub-pixels with different openings, wherein the sub-pixels having large openings are configured as the sub-pixels displaying blue, so as to further improve the service life of the display panel.

In one embodiment, as shown in FIGS. 2, 3, and 4, the first pixel repeating unit 121 includes four first sub-pixels 123. The four first sub-pixels 123 include two green first sub-pixels 123c displaying green, one red first sub-pixel 123b displaying red, and one blue first sub-pixel 123a displaying blue.

Correspondingly, the second pixel repeating unit 122 includes four second sub-pixels 124. The four second sub-pixels 124 include two green second sub-pixels 124c displaying green, one red second sub-pixel 124b displaying red, and one blue second sub-pixel 124a displaying blue.

It can be understood that by providing the first pixel repeating unit 121 and the second pixel repeating unit 122 to include sub-pixels displaying three colors of red, green, and blue, the display effect of the display panel can be further improved, thereby achieving full-color display.

In one embodiment, as shown in FIG. 3 and FIG. 4, in the second pixel repeating unit 122, orthographic projections of the second sub-pixels 124 on the substrate 11 adjoin each other.

It can be understood that by the arrangement of the orthographic projections of the second sub-pixels 124 adjoining each other on the substrate 11 in the second pixel repeating unit 122, the second sub-pixels 124 in the second pixel repeating unit 122 can be gathered as much as possible, so that a gap between adjacent ones of the second pixel repeating units 122 is maximized, and the area ratio of the cathode inhibition layer in the second display area SA is further increased, thereby achieving an effect of further improving light transmittance of a photosensitive area of the display panel.

The present application further provides a mobile terminal, including the display panel and the photosensitive element described above. The photosensitive element is arranged corresponding to the second display area.

Specifically, the photosensitive element includes, but not limited to, cameras, infrared sensors, fingerprint sensors, distance sensors, and the like.

Accordingly, in the present application, the second pixel repeating units 122 are disposed in the second display area SA and one of the second pixel repeating units 122 includes the second sub-pixels 124, wherein the number of the second sub-pixels 124 in the second pixel repeating unit 122 is the same as the number of the first sub-pixels 121 in the first pixel repeating unit 123, and the distance between any two of the second sub-pixels 124 in the second pixel repeating unit 122 is less than the distance between any two of the first sub-pixels 123 in the first pixel repeating unit 121. With the above structure, in the second display area SA, the second sub-pixels 124 in the second pixel repeating unit 122 are arranged more compactly. On the basis of not reducing the PPI of the display panel in the second display area SA, the gap between the second pixel repeating units 122 is significantly greater than the gap between the first pixel repeating units 121. The cathode inhibition block 1302 is disposed between two of the second pixel repeating units 122 and is configured to prevent the material of the cathode layer 1303 from being deposited in the area where the cathode inhibition block 1302 is disposed, so as to achieve an effect of reducing the area ratio of the cathode layer 1303 in the display panel and increasing the light transmittance of the panel, so that the light transmittance of the second display area SA of the display panel is improved as a whole. Compared with prior art, the light transmittance is increased by 86%-90%, which greatly improves the user experience.

It can be understood that for those of ordinary skill in the art, equivalent substitutions or changes can be made according to the technical solution and inventive concept of the present application, and all these changes or substitutions should fall within the protection scope of the appended claims of the present application.

What is claimed is:

1. A display panel, comprising:
   a first display area and a second display area;
   a substrate;
   a light-emitting layer located on a side of the substrate and comprising a plurality of first pixel repeating units disposed in the first display area, wherein one of the first pixel repeating units comprises a plurality of first sub-pixels;
   a plurality of second pixel repeating units disposed in the second display area, wherein one of the second pixel repeating units comprises a plurality of second sub-pixels, number of the second sub-pixels in the second pixel repeating unit is same as number of the first sub-pixels in the first pixel repeating unit, and a distance between any two of the second sub-pixels in the second pixel repeating unit is less than a distance between any two of the first sub-pixels in the first pixel repeating unit; and
   a cathode inhibition layer disposed on a side of the light-emitting layer away from the substrate and comprising a plurality of cathode inhibition blocks located in the second display area and disposed between adjacent ones of the second pixel repeating units; and
   a cathode layer disposed on the light-emitting layer and located on the side of the light-emitting layer away from the substrate, wherein an opening is located in the cathode layer corresponding to a position of each of the cathode inhibition blocks.

2. The display panel of claim 1, wherein an area of each of the first pixel repeating units is larger than an area of each of the second pixel repeating units.

3. The display panel of claim 2, wherein a distribution density of the second pixel repeating units in the second display area is same as a distribution density of the first pixel repeating units in a region of the first display area corresponding to a shape and area of the second display area.

4. The display panel of claim 3, wherein a distribution density of the second sub-pixels in the second display area is same as a distribution density of the first sub-pixels in the region of the first display area corresponding to the shape and the area of the second display area.

5. The display panel of claim 4, wherein a distribution density of the first sub-pixels is different from a distribution density of the second sub-pixels within a unit area.

6. The display panel of claim 5, wherein an arrangement of the first sub-pixels in the first pixel repeating unit is same as an arrangement of the second sub-pixels in the second pixel repeating unit.

7. The display panel of claim 1, wherein in a direction perpendicular to the substrate, a minimum distance between an orthographic projection of each of the cathode inhibition blocks and an orthographic projection of adjacent one of the second pixel repeating units ranges from 2 microns (μm) to 10 μm.

8. The display panel of claim 7, wherein in the direction perpendicular to the substrate, a minimum distance between the orthographic projection of the cathode inhibition block and an orthographic projection of a closest one of the second sub-pixels of the adjacent one of the second repeating units ranges from 2 μm to 10 μm.

9. The display panel of claim 7, wherein in the direction perpendicular to the substrate, a minimum distance between an orthographic projection of the opening and the orthographic projection of the adjacent one of the second repeating unit ranges from 2 μm to 10 μm.

10. The display panel of claim 9, wherein in the direction perpendicular to the substrate, a minimum distance between the orthographic projection of the opening and an orthographic projection of a closest one of the second sub-pixels of the adjacent one of the second repeating units ranges from 2 μm to 10 μm.

11. The display panel of claim 7, wherein in the second display area, an area ratio of the cathode inhibition layer ranges from 5% to 95%.

12. The display panel of claim 1, wherein an area of the opening is less than that of a corresponding one of the cathode inhibition blocks, and the cathode layer covers at least part of an edge of the corresponding cathode inhibition block.

13. The display panel of claim 1, further comprising:
    a driving circuit layer disposed between the substrate and the light-emitting layer and comprising a plurality of first driving circuits for driving the first sub-pixels and a plurality of second driving circuits for driving the second sub-pixels; and
    a transition area defined between the first display area and the second display area;
    wherein the first driving circuits are disposed in the first display area and electrically connected with the corresponding first sub-pixels, and
    the second driving circuits are disposed in the transition area and electrically connected to the corresponding second sub-pixels, or the second driving circuits are arranged in the second display area and disposed in a stack arrangement with the second pixel repeating unit including the second sub-pixels corresponding to the second driving circuits, wherein the second driving circuits are electrically connected to the corresponding second sub-pixels.

14. The display panel of claim 13, wherein the second driving circuits are further electrically connected to a plurality of the second sub-pixels displaying a same color in the corresponding second pixel repeating unit.

15. The display panel of claim 1, wherein the second sub-pixels comprise first color sub-pixels, second color sub-pixels, and third color sub-pixels, and each of the second pixel repeating units at least comprises one of the first color sub-pixels, one of the second color sub-pixels, and one of the third color sub-pixels.

16. The display panel of claim 15, wherein the first color sub-pixels display blue, the second color sub-pixels display red, and the third color sub-pixels display green.

17. A mobile terminal, comprising a display panel and a photosensitive element disposed corresponding to the display panel;
wherein the display panel comprises a first display area and a second display area;
a substrate;
a light-emitting layer located on a side of the substrate and comprising:
a plurality of first pixel repeating units disposed in the first display area, wherein one of the first pixel repeating units comprises a plurality of first sub-pixels;
a plurality of second pixel repeating units disposed in the second display area, wherein one of the second pixel repeating units comprises a plurality of second sub-pixels, number of the second sub-pixels in the second pixel repeating unit is same as number of the first sub-pixels in the first pixel repeating unit, and a distance between any two of the second sub-pixels in the second pixel repeating unit is less than a distance between any two of the first sub-pixels in the first pixel repeating unit; and
a cathode inhibition layer disposed on a side of the light-emitting layer away from the substrate and comprising a plurality of cathode inhibition blocks located in the second display area and disposed between adjacent ones of the second pixel repeating units;
a cathode layer disposed on the light-emitting layer and located on the side of the light-emitting layer away from the substrate, wherein an opening is located in the cathode layer corresponding to a position of each of the cathode inhibition blocks.

18. The mobile terminal of claim 17, wherein the photosensitive element comprises any one of a camera, an infrared sensor, a fingerprint sensor, or a distance sensor.

19. The mobile terminal of claim 17, wherein an area of each of the first pixel repeating units is larger than an area of each of the second pixel repeating units.

20. The mobile terminal of claim 19, wherein a distribution density of the second pixel repeating units in the second display area is same as a distribution density of the first pixel repeating units in a region of the first display area corresponding to a shape and area of the second display area.

* * * * *